United States Patent
Habib et al.

(10) Patent No.: US 9,865,713 B2
(45) Date of Patent: Jan. 9, 2018

(54) EXTREMELY LARGE SPIN HALL ANGLE IN TOPOLOGICAL INSULATOR PN JUNCTION

(71) Applicant: UNIVERSITY OF VIRGINIA PATENT FOUNDATION

(72) Inventors: K. M. Masum Habib, Charlottesville, VA (US); Redwan Noor Sajjad, Charlottesville, VA (US); Avik Ghosh, Charlottesville, VA (US)

(73) Assignee: UNIVERSITY OF VIRGINIA PATENT FOUNDATION, Charlottesville, VA (US)

(*) Notice: Subject to any disclaimer, the term of this patent is extended or adjusted under 35 U.S.C. 154(b) by 0 days.

(21) Appl. No.: 14/871,923

(22) Filed: Sep. 30, 2015

(65) Prior Publication Data

US 2016/0351696 A1    Dec. 1, 2016

Related U.S. Application Data

(60) Provisional application No. 62/168,887, filed on May 31, 2015, provisional application No. 62/199,303, filed on Jul. 31, 2015.

(51) Int. Cl.

| H01L 29/66 | (2006.01) |
|---|---|
| H01L 29/10 | (2006.01) |
| H01L 29/24 | (2006.01) |
| H01L 29/423 | (2006.01) |

(Continued)

(52) U.S. Cl.
CPC ...... *H01L 29/66984* (2013.01); *H01L 27/098* (2013.01); *H01L 29/0843* (2013.01); *H01L 29/1033* (2013.01); *H01L 29/1058* (2013.01); *H01L 29/24* (2013.01); *H01L 29/42312* (2013.01); *H01L 29/42364* (2013.01); *H01L 29/66136* (2013.01); *H01L 29/66977* (2013.01)

(58) Field of Classification Search
CPC ......... H01L 29/66984; H01L 29/66977; H01L 29/0843; H01L 29/42312; H01L 29/1058; H01L 29/66136; H01L 27/098
See application file for complete search history.

(56) References Cited

U.S. PATENT DOCUMENTS

2015/0221784 A1* 8/2015 McQueen ......... H01L 31/02242
                                                            257/459
2016/0268401 A1* 9/2016 Aleksov .............. H01L 29/7869

OTHER PUBLICATIONS

Wang et al, Topological p-n. junction, Physical Review B, 85, 235131, 2012.*

(Continued)

*Primary Examiner* — Joseph C Nicely
(74) *Attorney, Agent, or Firm* — Westerman, Hattori, Daniels & Adrian, LLP

(57) ABSTRACT

The interplay between chiral tunneling and spin-momentum locking of helical surface states leads to spin amplification and filtering in a 3D Topological Insulator (TI). Chiral tunneling across a TI pn junction allows normally incident electrons to transmit, while the rest are reflected with their spins flipped due to spin-momentum locking. The net result is that the spin current is enhanced while the dissipative charge current is simultaneously suppressed, leading to an extremely large, tunable longitudinal spin Hall angle (~20) at the reflected end. At the transmitted end, the angle stays close to one and the electrons are completely spin polarized.

18 Claims, 3 Drawing Sheets

(51) Int. Cl.
H01L 27/098 (2006.01)
H01L 29/08 (2006.01)

(56) References Cited

OTHER PUBLICATIONS

Habib et al, Chiral tunneling of topological states: towards the efficient generation of spin current using spin-momentum locking, http://www.arxiv.org, arxiv: 1408.6222V2.*
X.L. Qi and S.C. Zhang, Topological Insulators and Superconductors, Reviews of Modem Physics 83, 1057 (2011).
V. V. Cheianov and V. I. Palko, Selective Transmission of Dirac Electrons and Ballistic Magnetoresistance of n-p Junctions in Graphene, Phys. Rev. B 74, 041403 (2006).
A. F. Young and P. Kim, Quantum Interference and Klein Tunnelling in Graphene Heterojunctions, Nat. Phys. 5, 222 (2009).
R. N. Sajjad, S. Sutar, J. Lee, and A. W. Ghosh, Manifestation of Chiral Tunneling at a Tilted Graphene p-n Junction, Phys. Rev. B 86, 155412 (2012).
R. N. Sajjad and A. W. Ghosh, Manipulating Chiral Transmission by Gate Geometry: Switching in Graphene with Transmission Gaps, ACS nano 7, 9808 (2013).
Z. Wu, F. Peeters, and K. Chang, Spin and Momentum Filtering of Electrons on the Surface of a Topological Insulator, Appl. Phys. Lett. 98, 162101 (2011).
R. Takahashi and S. Murakami, Gapless Interface States between Topological Insulators with Opposite Dirac Velocities, Phys. Rev. Lett. 107, 166805 (2011).
J. Wang, X. Chen, B.F. Zhu, and S.C. Zhang, Topological p-n Junction, Phys. Rev. B 85, 235131 (2012).
L. Liu, C.F. Pai, Y. Li, H. W. Tseng, D. C. Ralph, and R. A. Buhrman, Spin-Torque Switching with the Giant Spin Hall Effect of Tantalum, Science 336, 555 (2012).
S. Datta, S. Salahuddin, and B. Behin-Aein, Non-volatile Spin Switch for Boolean and Non-Boolean Logic, Appl. Phys. Lett. 101, 252411 (2012).
O. Mosendz et al., Quantifying Spin Hall Angles from Spin Pumping: Experiments and Theory, Phys. Rev. Lett. 104, 346601 (2010).
L. Liu, T. Moriyama, D. C. Ralph, and R. A. Buhrman, Spin-Torque Ferromagnetic Resonance Induced by the Spin Hall Effect, Phys. Rev. Lett. 106, 036601 (2011).
A. Mellnik et al., Spin-Transfer Torque Generated by a Topological Insulator, Nature 511,449 (2014).
Y. Fan et al., Magnetization Switching through Giant Spin—Orbit Torque in a Magnetically Doped Topological Insulator Heterostructure, Nature Materials 13, 699 (2014).
J.H. Gao, J Yuan, W.Q. Chen, Y. Zhou, and F.C. Zhang, Giant Mesoscopic Spin Hall Effect on the Surface of Topological Insulator, Phys. Rev. Lett. 106, 057205 (2011).
S. Manipatruni, D. E. Nikonov, and I. A. Young, Energy-Delay Performance of Giant Spin Hall Effect Switching for Dense Magnetic Memory, Applied Physics Express 7, 103001 (2014).
J. Lee, J.H. Lee, J. Park, J. S. Kim, and H.J. Lee, Evidence of Distributed Robust Surface Current Flow in 3D Topological Insulators, Phys. Rev. X 4, 011039 (2014).
J. Chen et al., Gate-Voltage Control of Chemical Potential and Weak Antilocalization in Bi2Se3, Phys. Rev. Lett. 105, 176602 (2010).
A. A. Burkov and D. G. Hawthorn, Spin and Charge Transport on the Surface of a Topological Insulator, Phys. Rev. Lett. 105, 066802 (2010).
Y. Tserkovnyak and D. Loss, Thin-Film Magnetization Dynamics on the Surface of a Topological Insulator, Phys. Rev. Lett. 108, 187201 (2012).
E. I. Rashba, Spin Currents in Thermodynamic Equilibrium: The Challenge of Discerning Transport Currents, Phys. Rev. B 68, 241315 (2003).
I.V. Tokatly, Equilibrium Spin Currents: Non-Abelian Gauge Invariance and Color Diamagnetism in Condensed Matter, Phys. Rev. Lett. 101, 106601 (2008).
E. B. Sonin, Proposal for Measuring Mechanically Equilibrium Spin Currents in the Rashba Medium, Phys. Rev. Lett. 39, 266602 (2007).
Q.F. Sun and X.C. Xie, Definition of the Spin Current: The Angular Spin Current and Its Physical Consequences, Phys. Rev. B 72, 245305 (2005).
O.V. Yazyev, J.E. Moore, and S. G. Louie, Spin Polarization and Transport of Surface States in the Topological Insulators Bi2Se3 and Bi2Te3 from First Principles, Phys. Rev. Lett. 105, 266806 (2010).
S. Hong, V. Diep, S. Datta, and Y. P. Chen, Modeling Potentiometric Measurements in Topological Insulators Including Parallel Channels, Phys. Rev. B 86, 085131 (2012).
Y. Zhang, T.T. Tang, C. Girit, Z. Hao, M. C. Martin, A. Zettl, M. F. Crommie, Y. R. Shen, and F. Wang, Direct Observation of a Widely Tunable Bandgap in Bilayer Graphene, Nature 459, 820 (2009).
R. Stacey, Eliminating Lattice Fermion Doubling, Phys. Rev. D 26,468 (1982).
L. Susskind, Lattice Fermions, Phys. Rev. D 16, 3031 (1977).
A. N. M. Zainuddin, S. Hong, L. Siddiqui, S. Srinivasan, and S. Datta, Voltage-Controlled Spin Precession, Phys. Rev. B 84, 165306 (2011).

* cited by examiner

EXTREMELY LARGE SPIN HALL ANGLE IN TOPOLOGICAL INSULATOR PN JUNCTION

RELATED APPLICATION

This application claims priority to U.S. Provisional Application No. 62/168,887, "Extremely Large Spin Hall Angle in Topological Insulator (TI) pn Junction," filed May 31, 2015, and 62/199,303. "Extremely Large Spin Hall Angle in Topological Insulator (TI) pn Junction," filed Jul. 31, 2015, which applications are incorporated by reference herein in their entireties.

This invention was made with government funds under Agreement No. 70NANB12H107 awarded by NIST. The U.S. Government has rights in this invention.

BACKGROUND

Since their theoretical prediction and experimental verification in quantum wells and bulk crystals. Topological Insulators (TIs) have been of great interest in condensed matter physics, even prompting their classification as a new state of matter [Document 1]. The large spin orbit coupling in a TI leads to an inverted band separated by a bulk bandgap. Symmetry considerations dictate that setting such a TI against a normal insulator (including vacuum) forces a band crossing at their interface, leading to gapless edge (for 2D) and surface (for 3D) states protected by time reversal symmetry. At low energies, the TI surface Hamiltonian $H=v_F\hat{z}(\sigma\times p)$ [Document 1] resembles the graphene Hamiltonian $H=v_F\sigma\cdot p$ except that the Pauli matrices in TI represent real-spins instead of pseudo-spins in graphene. This suggests that the chiral tunneling (the angle dependent transmission) in a graphene pn junction [Documents 2-5] is expected to appear in a TI pn junction (TIPNJ) as well. Although TIPNJs have been studied recently [Documents 6-8], the implication of chiral tunneling combined with spin-momentum locking in spintronics has received little attention.

The energy dissipation of a spintronic device strongly depends on the efficiency of spin current generation. The efficiency is measured by the spin-charge current gain $$\beta = \frac{2I_s/\hbar}{I_q/q},$$

where $I_s$ and $I_q$ are the non-equilibrium spin and charge currents respectively. Increasing $\beta$ reduces the energy dissipation quadratically. The gain for a regular magnetic tunnel junction is less than 1 [Document 9]. The discovery of Giant Spin Hall Effect (GSHE) [Document 10] shows a way to achieve $\beta>1$ by augmenting the spin Hall angle $\theta_H$ with an additional geometrical gain [Document 11]. The intrinsic gain $\theta_H$ for various metals and metal alloys has been found to vary between 0.07-0.3 [Documents 10, 12, 13]. Recently. $Bi_2Se_3$-based TI has been reported to have 'spin torque ratio' (a quantity closely related to $\theta_H$) of 2-3.5 [Document 14] and has been shown to switch a soft ferromagnet at low temperature [Document 15]. An oscillatory spin polarization has also been predicted in TI using a step potential [Document 16].

The document is herein incorporated by the following references in its entirety.

DOCUMENT LISTS

1. X.-L. Qi and S.-C. Zhang, Reviews of Modern Physics 83, 1057 (2011).
2. V. V. Cheianov and V. I. Falko, Phys. Rev. B 74, 041403 (2006).
3. A. F. Young and P. Kim. Nat. Phys. 5, 222 (2009).
4. R. N. Sajjad, S. Sutar, J. Lee, and A. W. Ghosh, Phys. Rev. B 86, 155412 (2012).
5. R. N. Sajjad and A. W. Ghosh, ACS nano 7, 9808 (2013).
6. Z. Wu. F Peeters, and K. Chang, Appl. Phys. Lett. 98, 162101 (2011).
7. R. Takahashi and S. Murakami, Phys. Rev. Lett. 107, 166805 (2011).
8. J. Wang, X. Chen, B.-F. Zhu, and S.-C. Zhang, Phys. Rev. B 85, 235131 (2012).
9. S. Datta, V. Q. Diep, and B. Behin-Aein, "What Constitutes a Nanoswitch? A Perspective," in Emerging Nanoelectronic Devices, edited by A. Chen, J. Hutchby, V. Zhirnov, and G. Bourianoff (John Wiley and Sons, 2015) Chap. 2, p. 22.
10. L. Liu, C.-F. Pai, Y. Li, H. W. Tseng, D. C. Ralph, and R. A. Buhrman, Science 336, 555 (2012).
11. S. Datta, S. Salahuddin, and B. Behin-Aein, Appl. Phys. Lett. 101, 252411 (2012).
12. O. Mosendz et al., Phys. Rev. Lett. 104, 046601 (2010).
13. L. Liu, T. Moriyama, D. C. Ralph, and R. A. Bubrman, Phys. Rev. Lett. 106, 036601 (2011).
14. A. Mellnik et al., Nature 511, 449 (2014).
15. Y. Fan et al., Nature Materials 13, 699 (2014).
16. J.-H. Gao, J. Yuan, W.-Q. Chen. Y. Zhou, and F.-C. Zhang, Phys. Rev. Lett. 106, 057205 (2011).
17. S. Manipatruni, D. E. Nikonov, and I. A. Young, Applied Physics Express 7, 103001 (2014).
18. J. Lee, J.-H. Lee, J. Park, J. S. Kim, and H.-J. Lee, Phys. Rev. X 4, 011039 (2014).
19. J. Chen et al., Phys. Rev. Lett. 105, 176602 (2010).
20. A. A. Burkov and D. G. Hawthorn, Phys. Rev. Lett. 105, 066802 (2010).
21. Y. Tserkovnyak and D. Loss, Phys. Rev. Lett. 108, 187201 (2012).
22. E. I. Rashba, Phys. Rev. B 68, 241315 (2003).
23. I. V. Tokatly, Phys. Rev. Lett. 101, 106601 (2008).
24. E. B. Sonin, Phys. Rev. Lett. 99, 266602 (2007).
25. F. MAHFOUZI and B. K. NIKOLI. SPIN 03, 1330002 (2013).
26. Supplemental material for the details of the discretized k.p Hamiltonian, the NEGF method for non-equilibrium spin current and the analytical expression for the total current. It includes Documents 20, 21, 29-34.
27. Q.-f. Sun and X. C. Xie, Phys. Rev. B 72, 245305 (2005).
28. O. V. Yazyev, J. E. Moore, and S. G. Louie, Phys. Rev. Lett. 105, 266806 (2010).
29. S. Hong, V. Diep, S. Datta, and Y. P. Chen, Phys. Rev. B 86, 085131 (2012).
30. Y. Zhang, T.-T. Tang, C. Girit. Z. Hao, M. C. Martin, A. Zettl, M. F. Crommie, Y. R. Shen, and F. Wang, Nature 459, 820 (2009).
31. R. Stacey, Phys. Rev. D 26, 468 (1982).
32. L. Susskind, Phys. Rev. D 16, 3031 (1977).
33. A. N. M. Zainuddin, S. Hong. L. Siddiqui, S. Srinivasan, and S. Datta, Phys. Rev. B 84, 165306 (2011).
34. See Eq. 8.6.5, p. 317 in S. Datta, Electronic Transport in Mesoscopic Systems, Cambridge University Press, Cambridge, England (1997).

SUMMARY

In accordance with some embodiments, it is shown that the chiral tunneling of helical states leads to an large spin-charge current gain due to the simultaneous amplification of spin current and suppression of charge current in a 3D TIPNJ. The chiral tunneling allows only the near normal incident electrons to transmit, suppressing the charge current significantly. The rest of the electrons are reflected and their spins are flipped due to the spin-momentum locking, enhancing the spin current at the source end. The gain at drain, however, remains close to one and the spin polarization becomes ~100%. Any gate controllable, helical Dirac-Fermionic pn junction should exhibit a giant spin-charge current gain which may open a new way to design electronic devices such as spintronic devices.

BRIEF DESCRIPTION OF THE DRAWINGS

For a better understanding of the aforementioned embodiments of the invention as well as additional embodiments thereof, reference should be made to the Description of Illustrative Embodiments below, in conjunction with the following drawings in which like reference numerals refer to corresponding parts throughout the figures.

DESCRIPTION OF ILLUSTRATIVE EMBODIMENTS

Reference will now be made in detail to embodiments, examples of which are illustrated in the accompanying drawings. In the following detailed description, numerous specific details are set forth in order to provide a thorough understanding of the present invention. However, it will be apparent to one of ordinary skill in the art that the present invention may be practiced without these specific details. In other instances, well-known methods, procedures, components, circuits, and networks have not been described in detail so as not to unnecessarily obscure aspects of the embodiments.

Figure 1:
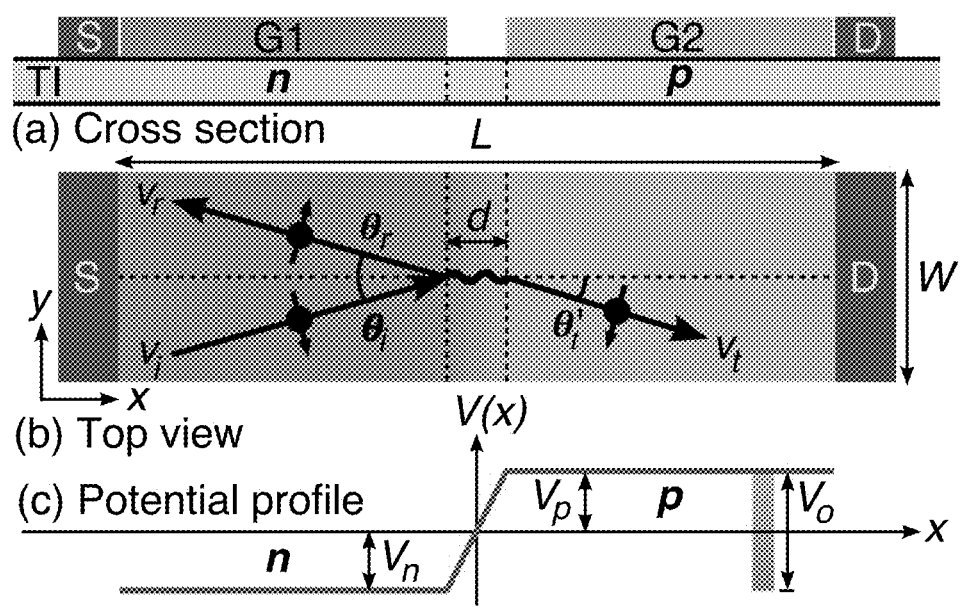
FIG. 1. illustrates (a) cross section of the TIPNJ, (b) top view of the device showing the directions of incident, reflected and transmitted electrons and their spins, and (c) linear approximation of potential energy profile in accordance with some embodiments.

The interplay between the chiral tunneling and spin momentum locking in TIPNJ shown in FIG. 1 leads to an extremely large, electrically tunable spin-charge current gain β even without utilizing any geometric gain. The chiral tunneling in TIPNJ only allows electrons with very small incident angle to pass through and all other electrons are reflected back to the source in the same way as graphene. As a result, charge current going through the junction decreases. Due to spin-momentum locking, the injected electrons have down spin but the reflected electrons have up spin, which enhances the spin current at the source contact. These result in a gate tunable, extraordinarily large spin-charge current gain. In a split-gate, symmetrically doped TIPNJ, the spin-charge current gain is, $$\beta \approx \frac{1+R_{av}}{1-R_{av}} \approx \pi \sqrt{\frac{qV_o d}{\hbar v_F}} \quad (1)$$

at the source contact for small drain bias. Here, $R_{av}$ is the reflection probability averaged over all modes, $V_o$ is the built in potential of the TIPNJ and d is the split between the gates. For large bias, Eq. (1) can be approximated as $\beta \approx 2\sqrt{qV_o d/\hbar v_F}$. In a typical TIPNJ with d=100 nm, $V_o$=0.3 V and $v_F$=0.5×10$^6$ m/s, β at source is ~30 for small bias and ~20 for large bias. At drain, β remains close to 1. Therefore, β is approximately between 1 and 20. The p region is highly spin polarized since only the small angle modes (with spin-y) exist there. The large β in a TIPNJ does not require any geometrical gain and can potentially be larger than the net gain in GSHE systems like β-Ta and W [Document 17] that rely on the additional geometrical gain. In addition, it is gate tunable, meaning that it is possible to turn its value continuously from 1.5 to 20. The flows of spin and charge are parallel in TIPNJ, as opposed to the transverse flow in GSHE.

The cross section and the top view of the model TIPNJ device are shown in FIGS. 1(a) and 1(b), respectively. The 3D TI is assumed to be a class of materials including $Bi_2Se_3$ and $Bi_2Te_3$, which has the largest bulk bandgap of 350 meV. The source (S) and the drain (D) contacts are placed on the top surface of the TI slab. It is assumed that the electron conduction happens only on the top surface. This is a good approximation since the device is operated within the bulk bandgap to minimize the bulk conduction and it is numerically verified that only a small part of the total current goes through the side walls which was also seen in experiment [Document 18]. The p and n regions are electrically doped using two external gates G1 and G2 separated by the split distance d. Such gate controlled doping of TI surface states has been demonstrated experimentally for $Bi_2Se_3$ [Document 19]. The device has a built-in potential $V_o=V_p+V_n$ distributed between the p and n regions as shown in FIG. 1(c) assuming a linear potential profile inside the split region. Electrons are injected from source and collected at drain by a bias voltage $V_{DS}$.

Although an equilibrium spin current exists on the TI surface, it has no consequences for the measurable spin current [Documents 20 and 21]. Therefore, the non-equilibrium spin current is only considered. There has been a lot of discussions on the equilibrium spin current in the literature [Documents 22-25]. A biasing scheme that defines the equilibrium state is chosen. The drain contact is connected to the ground and the gates are referenced with respect to the ground so that $\mu_D$=0 and $\mu_S$=$qV_{DS}$ where $\mu_D$ and $\mu_S$ are the chemical potentials of the drain and the source contacts, respectively. The equilibrium current, $I_{s_0}$ is then defined by $V_{DS}$=0 and $\mu_D=\mu_S$=0. The non-equilibrium spin current is obtained by subtracting $I_{s_0}$ from the total spin current calculated for nonzero bias ($\mu_D$=0 and $\mu_S$=$qV_{DS}$). A detailed description of this method is discussed in the Supplement [Document 26].

Figure 2:
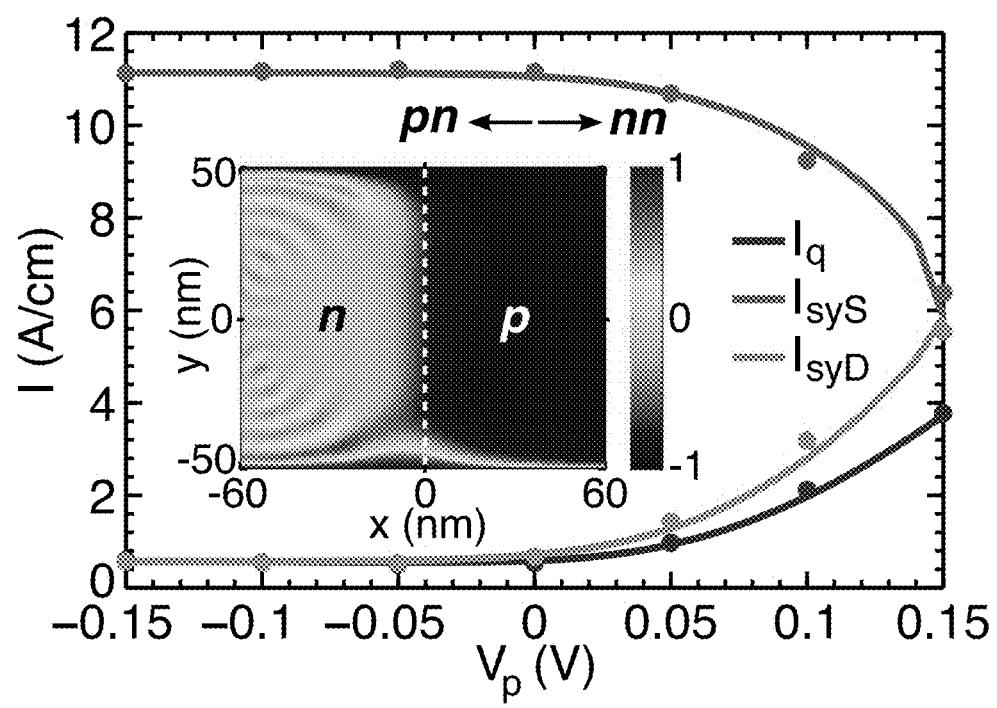
FIG. 2. illustrates charge and spin current vs. gate voltage on the p-side ($V_p$) at $V_n$=0.15 V in accordance with some embodiments.
Figure 3:
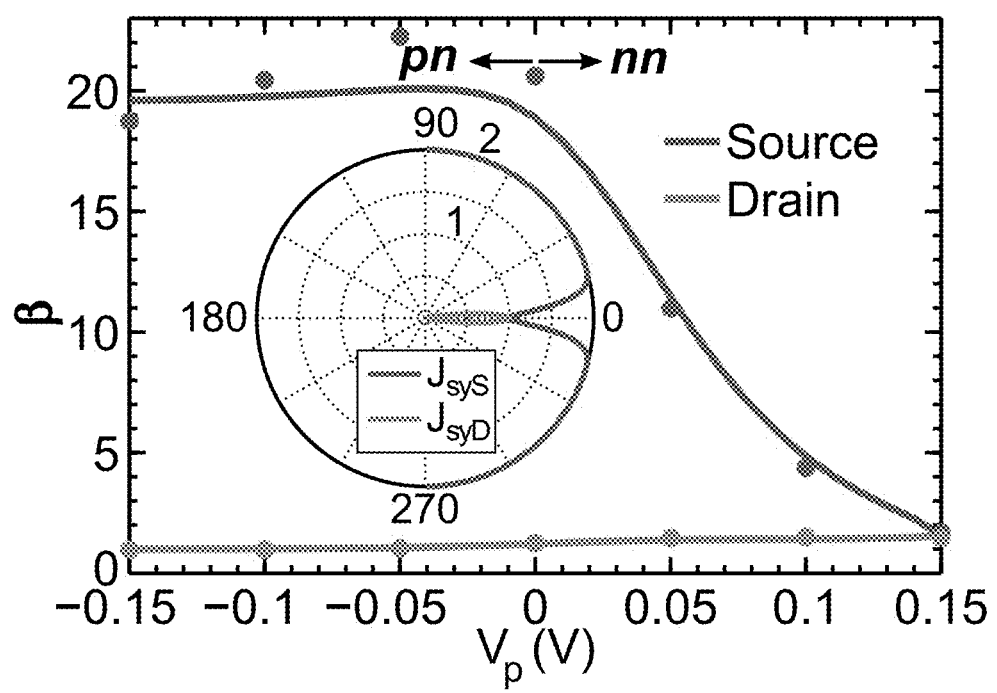
FIG. 3. illustrates longitudinal spin Hall angle $\theta_H$ vs. $V_p$ at $V_n$=0.15 V in accordance with some embodiments.

The spin current, the charge current and the spin to charge current ratio are shown in FIGS. 2 and 3 as functions of gate bias of the p region. The solid lines were calculated using Eqs. (2)-(4) and S3 [Document 26] evaluated at the source and drain contacts. The discrete points were calculated using the non-equilibrium Green's function (NEGF) formalism and the discretized k·p Hamiltonian which captures the effects of edge reflections. Both analytical and numerical simulations were done for a device with length L=120 nm, width W=100 nm, split length d=100 nm, drain bias $V_{DS}$=0.1 V, gate voltage $V_n$=0.15V at room temperature. When the gate voltage of p region $V_p$=0.15 V, the channel is a perfect nn type with uniform potential profile. Thus, all the modes are allowed to transmit from the source to the drain and there is no reflection. Hence, the charge current is maximum, spin current at the source and drain are equal and $\beta=\pi/2$ as shown in FIG. 3. When the gate voltage $V_p$ is decreased to $-0.15$ V, the potential profile is no longer uniform, the channel becomes a pn junction and most of the electrons are reflected back from the junction and therefore, charge current is reduced. Since the incident and reflected waves have opposite spins, the reflected waves enhances the spin current at the source end and $\beta$ becomes large at the source contact. In the drain contact, however, only the transmitted electrons are collected and $\beta$ remains close to 1. Thus, $\beta$ changes from 1.5 to 20 at source contact and remains close to 1 at the drain when the device is driven from the nn to the pn regime. The agreement between the numerical and the analytical results shown in FIGS. 2 and 3 indicates that the physics described here is robust against the edge reflection at finite drain bias and room temperature.

Derivation of Eq. (1):

The effective Hamiltonian for 3D TI surface states is started with and the similar procedure as described in [Document 27] is followed to obtain the continuity equation for spin, $$\frac{\partial s}{\partial t} = -\nabla \cdot \hat{J}_s + \hat{J}_w.$$

Here, $\hat{J}_s$ is a rank 2 tensor describing the translational motion of spin and $\hat{J}_\omega$ is a vector describing the rate of change of spin density due to spin precession at location r and time t. The quantity $\hat{J}_\omega$ is also referred to as spin torque [Document 27]. Among nine elements of $\hat{J}_s$, only $$\hat{J}_{sy}^x = -\frac{\hbar v_F}{2}I \text{ and } \hat{J}_{sx}^y = \frac{\hbar v_F}{2}I$$

are nonzero for TI. The current density operator $J_{sy}^x$ describes spin current carried by spin-y along x direction etc. Inside the gate regions where there is no scattering, the angular term $J_\omega$ is zero and the spin current is conserved. However, at the pn junction interface, electrons are reflected which is accompanied by a change in the spin angular momentum. As a result, inside the pn junction interface, $J_\omega \neq 0$ and the spin current is not conserved [Document 26]. At steady state, $\nabla \cdot \hat{J}_s = \hat{J}_\omega$ and hence, for the two terminal device shown in FIG. 1, the difference between the spin currents at the source and the drain terminal is the spin torque generated by the TIPNJ. Similarly, the charge current density operators $\hat{J}^x = -qv_F\sigma^y$ and $\hat{J}^y = qv_F\sigma^x$ is obtained, where $\hat{J}^x$ describes the motion of electrons moving along the $\hat{x}$ is direction. For the TIPNJ, since there is no net charge or spin transfer in $\hat{y}$ direction, $J_{sx}^y=0$ and $J^y=0$.

The wavefunction of an electron in the n side ($x<-d/2$) of the TIPNJ shown in FIG. 1 can be expressed as $|\psi\rangle = |\psi_i\rangle + r|\psi_r\rangle$, where $|\psi_i\rangle$ is the incident wave, $|\psi_r\rangle$ is the reflected wave and r is the reflection coefficient. The general form of spin-momentum locked incident wave with incident angle $\theta_i$ and energy E is $|\psi_i\rangle = 1/\sqrt{2A}(1-s_i i e^{i\theta_i})^T e^{ik_i \cdot r}$ where A=WL is the area of the device, $k_i$ is the wavevector with magnitude $$k_i = \frac{|E+qV_n|}{\hbar v_F},$$

and direction $\theta_i$ and $s_i=\text{sgn}(E+qV_n)$. Similarly, the reflected wave is given by $|\psi_r\rangle = 1/\sqrt{2A}(1-s_i i e^{i\theta_r})^T e^{ik_r \cdot r}$ where $k_r=k_i$ and $\theta_r=\pi-\theta_i$. In the p side ($x>d/2$), only the transmitted wave exist. Hence, the wave function of electron is expressed as $|\psi\rangle = t|\psi_t\rangle$ with $|\psi_t\rangle = 1/\sqrt{2A}(1-s_t i e^{i\theta_t})^T e^{ik_t \cdot r}$ where wavevector $$k_t = \frac{|E+qV_p|}{\hbar v_F},$$

$\theta_t$ is the transmission angle, t is the transmission coefficient and $s_t=\text{sgn}(E+qV_p)$. Since the potential along $\hat{y}$ is uniform, the $\hat{y}$ component of wavevector must be conserved throughout the device. Thus, Snell's law for TI surface state is recovered: $k_i \sin\theta_i = k_t \sin\theta_t$. It follows from Snell's law and the opposite helicity of conduction and valence bands of TI surface states that the transmission angle $\theta_t=\pi-\theta'_t$ for $E<-qV_p$ and $\theta_t=\theta'_t$ for $E>-qV_p$ where $$\theta'_t = \sin^{-1}\left[\frac{E+qV_n}{E+qV_p}\sin\theta_i\right].$$

For electrons with $$\theta_i > \theta_c \equiv \sin^{-1}\left[\frac{E+qV_p}{E+qV_n}\right],$$

$\theta_t$ becomes complex and the electrons are reflected back to the source.

Inside the junction interface ($-d/2<x<d/2$), the wavevector varies in accordance with $$k(x) = \frac{|E-V(x)|}{\hbar v_F}.$$

For electrons with $k(x)<k_i \sin\theta_i$, the $\hat{x}$ component of k(x) becomes imaginary, the wavefunctions become evanescent and the electrons are reflected back. Considering the exponential decay inside the interface and matching the wavefunction across an abrupt pn junction, the transmission coefficient can be written as $$t = \frac{s_i e^{i\theta_i} + s_i e^{-i\theta_i}}{s_i e^{-i\theta_i} + s_i e^{i\theta_i}} e^{-\phi}$$

where $\varphi = \int \kappa(x)dx$ and $\kappa(x) = \sqrt{k_i^2 \sin^2\theta_i - k^2(x)}$ is the imaginary part of k(x).

Now, an electron injected from the source at angle $\theta_i$ is considered and energy E is transmitted from n to p and collected at drain. The probability current density for the transmitted electron is given by $J_{qt}(E, \theta_i) = |t|^2\langle\psi_t|\hat{J}^x|\psi_t\rangle$ which leads to the general expression for the charge current density $$J_q(E, \theta_i) \equiv J_{qt} = \frac{s_t q v_F}{A}|t|^2 \cos\theta_{tr} e^{-\theta_{ti}} e^{-\kappa_t L}, \quad (2)$$

where $\theta_{tr}=\text{Re}\{\theta_t\}$, $\theta_{ti}=\text{Im}\{\theta_t\}$ and $k_t=\text{Im}\{\hat{x}\cdot k_t\}$. Similarly, the probability current density for the incident wave is $J_{qi}(E, \theta_i)=s_i qv_F \cos\theta_i/A$. Hence, the transmission probability is given by $$T(E, \theta_i) \equiv J_{qt}/J_{qi} = \frac{\cos\theta_{tr}}{\cos\theta_i}|t|^2 e^{-\theta_{ti}} e^{-\kappa_t L},$$

which is the general form of transmission probability in graphene pn junction as presented in [Documents 2 and 4] and valid for all energies in nn, pn and pp regime. Similarly, the spin current density at drain is $$J_{syD}(E, \theta_i) = -\frac{\hbar}{2}\frac{v_F}{A}|t|^2 e^{-2\theta_{ti}} e^{-\kappa_t L}, \quad (3)$$

where the negative sign indicates that the spin current is carried by the down spin. The spin current at source has two components: (1) the incident current $$J_{syi}(E, \theta_i) = -\frac{\hbar v_F}{2A}$$

and the reflected current $$J_{syr}(E, \theta_i) = -\frac{\hbar v_F}{2A}|r|^2.$$

Therefore, the total spin current density is, $$J_{syS}(E, \theta_i) = -\frac{\hbar}{2}\frac{v_F}{A}(1+|r|^2) \quad (4)$$

where $|r|^2=1-|t|^2$. Eqs. (2)-(4) are valid for all energies in nn, pn and pp regimes. The total current is the sum of contributions from all electrons with positive group velocity along $\hat{x}$, weighted by the Fermi functions and integrated over all energies [Document 26]. Unlike the incident and reflected components of charge currents, $J_{syi}$ and $J_{syr}$ have the same sign. This is because when a spin-up electron is reflected from the pn junction interface, its spin is flipped due to the spin-momentum locking. Now, a spin-down electron going to the left has the same spin current as a spin-up electron going to the right. Hence, the spin currents due to the injected and the reflected electron add up enhancing the source spin current.

For symmetric pn junction, within the barrier ($-qV_n<E<-qV_p$), the transmission coefficient is dominated by the exponential term and becomes $t\approx e^{-\pi\hbar\ v_F k_i^2 d \sin^2\theta_i/2V_o}$. Hence, t is nonzero for electrons with very small incident angle ($\theta_i<<\theta_c$). For these electrons, $e^{-\theta_{ti}}\approx 1$, $e^{-\kappa_t L}\approx 1$ and $\cos\theta_t\approx\cos\theta_{tr}$. Therefore, the transmission probability becomes, $$T(E,\theta_i)\approx e^{-\pi\hbar\ v_F k_i^2 d \sin^2\theta_i/V_o} \quad (5)$$

which has the same form as the transmission probability in graphene pn junction [Documents 2 and 4]. The charge current density in symmetric pn junction is then, $$J_q(E, \theta_i) \approx q\frac{v_F}{A}[1 - R(E, \theta_i)] \quad (6)$$

and spin current densities at drain and source are $$J_{syD,S}(E, \theta_i) \approx -\frac{\hbar}{2}\frac{v_F}{A}[1 \mp R(E, \theta_i)] \quad (7)$$

where − and + signs are for D and S respectively, and $R(E, \theta_i)=1-T(E, \theta_i)$ is the reflection probability. Now, the spin-charge current gain can be expressed as $$\beta(E_F) = \frac{\int d\theta 2_q J_{syS}(E_F, \theta)}{\int d\theta\hbar, J_q(E_F, \theta)}$$

in the low bias limit. For symmetric pit junction, $\beta$ at the source contact reduces to the first expression in Eq. (1) where $$R_{av} = \frac{1}{\pi}\int d\theta\left[1 - e^{-\pi\hbar v_F k_i^2 d\sin^2\theta_i/V_o}\right]$$

is the average reflection probability. When the Fermi energy is at the middle of the barrier, $\hbar\ v_F k_f = V_o/2$ and $\beta$ is given by the second term of Eq. (1).

Eq. (5) clearly shows that $T(E, \theta_i)$ is nonzero only for electrons with very small $\theta_i$. Hence, only these electrons are allowed to transmit. For all other modes, the reflection probability $R(E, \theta_i)\approx 1$ and those electrons are reflected back from the pn junction interface to the source. Thus, only few modes with small $\theta_i$ contribute to $J_{syD}$ and $J_q$, whereas all other modes contribute to $J_{syS}$ as shown in the inset of FIG. 3 (Angle dependent normalized spin current densities at source and drain in symmetric pn regime. Spin current at drain ($J_{syD}$) is carried by small angle modes only. All other modes contribute to source spin current ($J_{syS}$) twice: (1) when they are injected and (2) when they are reflected since their spins are flipped.). This is also consistent with the spin polarization of TIPNJ shown in the inset of FIG. 2 (Spin polarization in symmetric pt regime. In the p region only transmitted modes (spin down) exist resulting in strong polarization (blue). In the n region, both the incident (spin down) and the reflected modes (spin up) exist, hence it is mostly unpolarized (green).) calculated using NEGF with negligible injection from the drain. In the p side, only the transmitted waves exist and the spins of these electrons are aligned to $-\hat{y}$ due to the spin-momentum locking. Therefore, the p side is highly spin polarized as illustrated by blue. On the other hand, in the n side, both the incident and the reflected waves exist with spins aligned to all the directions in x-y plane leading to the unpolarized it region indicated by green. This is completely different from the uniform nn or pp device where the spin polarization is $2/\pi$ throughout the channel [Documents 28 and 29]. Thus, the spin polarization shown in FIG. 2 is a key signature of spin filtering and amplification effect in TIPNJ, which can be measured by spin resolved scanning tunneling microscopy.

One way to measure $\beta$ is to pass the spin current through a ferromagnetic metal (FM) by using the FM as the source contact of TIPNJ. The magnetization of the FM needs to be in-plane so that it does not change the TI bandstructure. The spin current going through the FM will exert torque on the FM which can be measured indirectly using spin torque ferromagnetic resonance technique [Document 14] or directly by switching the magnetization (along $-\hat{y}$) of soft ferromagnets such as $(Cr_xBi_ySb_{1-x-y})_2Te_3$ at low temperature [Document 15]. Once the magnetization of the FM is switched from $-\hat{y}$ to $+\hat{y}$, the current injection will stop (since spin up states cannot move towards right) and the system will reach the stable state.

It will be apparent to those skilled in the art that various modifications and variations can be made in the disclosed embodiments of the present invention without departing from the spirit or scope of the invention. Thus, it is intended that the present invention covers the modifications and variations of the embodiments disclosed above provided that they come within the scope of any claims and their equivalents.

The electronic device in the present invention, including the spintronic device, covers any physical entity in an electronic system used to affect the electrons or their associated fields in a is manner consistent with the intended function of the electronic system. Components are generally intended to be connected together, usually by being soldered to a printed circuit board (PCB), to create an electronic circuit with a particular function. Components may be packaged singly, or in more complex groups as integrated circuits. Some common electronic components include capacitors, inductors, resistors, diodes, transistors, etc.

BROAD SCOPE OF THE INVENTION

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure, the following abbreviated terminology may be employed: "e.g." which means "for example."

What is claimed is:

1. An electronic device comprising a topological insulator pn junction,
the topological insulator pn junction including:
a source;
a drain; and
a plurality of gates,
wherein a chiral tunneling directs a movement of a plurality of electrons in the topological insulator pn junction.

2. The electronic device according to claim 1, wherein the plurality of gates are spatially separated.

3. The electronic device according to claim 1, wherein the topological insulator has helical states, wherein in the helical states, spin and momentum of the plurality of electrons are locked.

4. The electronic device according to claim 1, wherein the topological insulator is a class of materials including $Bi_2Se_3$ and $Bi_2Te_3$.

5. The electronic device according to claim 1, wherein the topological insulator has a bulk bandgap.

6. The electronic device according to claim 1, wherein the chiral tunneling across the topological insulator pn junction allows a part of the plurality of electrons to transmit through the drain and rest of the plurality of electrons to reflect back to the source.

7. The electronic device according to claim 6, wherein spins of the reflected electrons are flipped due to spin-momentum locking.

8. The electronic device according to claim 6, wherein the transmitted electrons have very small incident angle.

9. The electronic device according to claim 6, wherein a charge current going through the topological insulator pn junction is suppressed and a spin current at the source is amplified.

10. The electronic device according to claim 9, wherein a suppression of the charge current and an amplification of the spin current are done simultaneously.

11. The electronic device according to claim 6, wherein the chiral tunneling in the topological insulator pn junction results in a gate tunable, a large spin-charge current gain at a reflected end of the topological insulator pn junction.

12. The electronic device according to claim 11, wherein the gain at the reflected end is approximately 20.

13. The electronic device according to claim 11, wherein the gain at the reflected end, $\beta$, for small grain bias is defined as:

$$\beta \approx \frac{1+R_{av}}{1-R_{av}} \approx \pi\sqrt{\frac{qV_o d}{\hbar v_F}},$$

wherein $R_{av}$ is a reflection probability averaged over all modes, $V_o$ is a built in potential of the topological insulator pn junction, and d is a split between the plurality of gates.

14. The electronic device according to claim 11, wherein the gain at the reflected end, $\beta$, for large bias is approximated as:

$$\beta \approx 2\sqrt{\frac{qV_o d}{\hbar v_F}},$$

wherein $V_o$ is a built in potential of the topological insulator pn junction, and d is a split between the plurality of gates.

15. The electronic device according to claim 6, wherein a gain at a transmitted end of the topological insulator pn junction is close to one.

16. The electronic device according to claim 6, wherein the transmitted electrons are completely spin polarized at a transmitted end.

17. The electronic device according to claim 1, wherein flows of spin and charge are parallel.

18. A topological insulator pn junction comprising:
a source;
a drain; and
a plurality of gates,
wherein a chiral tunneling directs a movement of a plurality of electrons in the topological insulator pn junction.

\* \* \* \* \*